(12) United States Patent
Yutani et al.

(10) Patent No.: US 9,070,754 B2
(45) Date of Patent: Jun. 30, 2015

(54) METHOD OF MANUFACTURING A SEMICONDUCTOR DEVICE AND WAFER

(71) Applicant: Renesas Electronics Corporation, Kawasaki (JP)

(72) Inventors: Akinori Yutani, Kawasaki (JP); Kouji Soejima, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 5 days.

(21) Appl. No.: 13/752,194

(22) Filed: Jan. 28, 2013

(65) Prior Publication Data

US 2013/0207259 A1 Aug. 15, 2013

(30) Foreign Application Priority Data

Feb. 14, 2012 (JP) ................. 2012-029904

(51) Int. Cl.
*H01L 23/00* (2006.01)
*H01L 21/768* (2006.01)
*H01L 23/48* (2006.01)
*H01L 23/31* (2006.01)
(Continued)

(52) U.S. Cl.
CPC .......... *H01L 21/76885* (2013.01); *H01L 23/48* (2013.01); *H01L 23/3114* (2013.01); *H01L 23/3192* (2013.01); *H01L 21/561* (2013.01); *H01L 22/14* (2013.01); *H01L 24/11* (2013.01); *H01L 24/03* (2013.01); *H01L 24/05* (2013.01); *H01L 24/13* (2013.01); *H01L 2224/0345* (2013.01); *H01L 2224/0401* (2013.01); *H01L 2224/11001* (2013.01); *H01L 2224/11462* (2013.01); *H01L 2224/1147* (2013.01); *H01L 2224/11849* (2013.01); *H01L 2224/13022* (2013.01); *H01L 2224/94* (2013.01); *H01L 2224/11009* (2013.01);
(Continued)

(58) Field of Classification Search
CPC ..... H01L 23/528; H01L 23/544; H01L 24/10; H01L 24/81; H01L 24/94; H01L 21/02002; H01L 21/4853; H01L 21/4825; H01L 27/3223; H01L 29/6681; H01L 22/00; H01L 22/14; H01L 22/30; H01L 22/32; H01L 22/34
See application file for complete search history.

(56) References Cited

U.S. PATENT DOCUMENTS 6,085,968 A * 7/2000 Swindlehurst et al. ....... 228/254
6,146,984 A * 11/2000 Leibovitz et al. ............. 438/613
(Continued)

FOREIGN PATENT DOCUMENTS

JP 2004-018964 A 1/2004
JP 2004-200195 A 7/2004
(Continued)

*Primary Examiner* — David Zarneke
(74) *Attorney, Agent, or Firm* — McGinn IP Law Group, PLLC

(57) ABSTRACT

The present invention prevents bumps on semiconductor chips from sticking to probe needles and coming off from the semiconductor chips. A wafer has effective areas where a plurality of bumps (first bumps) are formed. The bumps are formed on the side of an active surface of the semiconductor chips. The wafer further has non-effective areas where a plurality of dummy bumps are formed. Among the dummy bumps, some positioned at the outermost circumference are dummy bumps (second bumps) that are smaller than the other bumps. The dummy bumps (second bumps) intersect the inner peripheral edge of a shielding member as viewed in a plan view. The dummy bumps (second bumps) are formed over third pad electrodes. A bump-formation insulating film is removed from over the entire third pad electrodes.

11 Claims, 15 Drawing Sheets

(51) Int. Cl.
  *H01L 21/56* (2006.01)
  *H01L 21/66* (2006.01)

(52) U.S. Cl.
  CPC .............. *H01L 2224/05572* (2013.01); *H01L 2224/131* (2013.01); *H01L 2224/16227* (2013.01); *H01L 2224/1302* (2013.01); *H01L 2224/13021* (2013.01); *H01L 2224/13027* (2013.01); *H01L 2224/14517* (2013.01); *H01L 2224/16225* (2013.01); *H01L 2924/13091* (2013.01); *H01L 24/14* (2013.01); *H01L 2924/00014* (2013.01)

(56) References Cited

U.S. PATENT DOCUMENTS

| | | | |
|---|---|---|---|
| 6,268,656 B1 * | 7/2001 | Leibovitz et al. | 257/737 |
| 6,287,895 B1 * | 9/2001 | Sato | 438/114 |
| 6,500,764 B1 * | 12/2002 | Pritchett | 438/690 |
| 6,706,621 B2 * | 3/2004 | Cox et al. | 438/612 |
| 7,709,295 B2 | 5/2010 | Fujimura | |
| 7,795,115 B2 | 9/2010 | Kameyama et al. | |
| 2008/0191205 A1 * | 8/2008 | Tsai et al. | 257/48 |
| 2012/0161328 A1 * | 6/2012 | Henry et al. | 257/773 |
| 2012/0256311 A1 * | 10/2012 | Takeda et al. | 257/737 |
| 2012/0261662 A1 * | 10/2012 | Liang et al. | 257/48 |
| 2012/0306071 A1 * | 12/2012 | Ullal et al. | 257/737 |
| 2013/0149841 A1 * | 6/2013 | Indyk et al. | 438/462 |
| 2014/0061897 A1 * | 3/2014 | Lin et al. | 257/737 |

FOREIGN PATENT DOCUMENTS

| | | |
|---|---|---|
| JP | 2007-214268 A | 8/2007 |
| JP | 2007-273941 A | 10/2007 |

\* cited by examiner

METHOD OF MANUFACTURING A SEMICONDUCTOR DEVICE AND WAFER

CROSS-REFERENCE TO RELATED APPLICATIONS

The disclosure of Japanese Patent Application No. 2012-029904 filed on Feb. 14, 2012 including the specification, drawings and abstract is incorporated herein by reference in its entirety.

BACKGROUND

The present invention relates to a method of manufacturing semiconductor devices and wafers, and more particularly, to a method of manufacturing a semiconductor device having bumps and a wafer.

Bumps of semiconductor devices are formed by an electroplating method as disclosed in, for example, Japanese Unexamined Patent Publication No. 2004-18964. The method of forming the bumps includes the following steps.

First, seed metal is formed over the entire top surface of a wafer. Second, a resist film is formed over this seed metal and then is exposed to light and developed. These steps form a resist pattern. This resist pattern has openings therein at areas where bumps are to be formed. The seed metal film is exposed at the bottom of the openings.

Then, an electrode is coupled to the seed metal film positioned at an edge of the wafer to supply electric power and the wafer is immersed in a plating solution. Through these steps bumps grow in the openings of the resist pattern.

The wafer is singulated through a dicing step into semiconductor chips as disclosed in Japanese Unexamined Patent Publication Nos. 2007-273941, 2007-214268, and 2004-200195.

SUMMARY

Before electroplating a wafer in a plating solution, the peripheral edge portion of the wafer is protected by a sealing member (or a sealing ring) to prevent the plating solution from adhering to electrodes formed in the peripheral edge portion. However, the grown bumps adhering to the sealing member make the sealing member less removable from the wafer. To reduce adhesion of the sealing member to the bumps, the bumps need to be formed within a given distance from the sealing member. To prevent bump formation within the distance, it is preferable to place a light-shielding ring over the resist film within the peripheral edge portion of the wafer so as not to expose the resist film to light during the exposure step of the resist film.

However, study of the inventors of the present invention have found out that very small bumps are formed at intersections of an edge of the light-shielding ring and areas where regular-size bumps are formed. In a probe inspection of semiconductor chips, such small bumps may stick to probe needles and may come off from the semiconductor chips. The small bumps sticking on the probe needles possibly cause malfunctions of the next semiconductor chips inspection.

The further problems and novel features will more fully appear from the following detailed description and the accompanying drawings of the invention.

In an embodiment of the present invention, a bump-formation insulating film that is used to form bumps is formed over a layer in which pad electrodes are formed. The bump-formation insulating film has first openings formed therein. The first openings are positioned over first pad electrodes. The first pad electrodes are formed in effective areas which will be commercially available semiconductor chips. In non-effective areas which will be commercially unavailable semiconductor chips, second pad electrodes are formed. Bumps over the first pad electrodes grow in bump-formation openings, which are used to form bumps, of a photosensitive film. When the photosensitive film is exposed to light, the peripheral edge portion of a wafer is blocked from the light by a light-shielding member. Among the second pad electrodes, third pad electrodes intersecting the edge of the light-shielding member are entirely exposed from the bump-formation insulating film.

In another embodiment of the invention, dummy bumps are formed in commercially unavailable non-effective areas. The dummy bumps are in the shape of a frame. Dummy-bump openings used to form the dummy bumps are larger in area than the aforementioned bump-formation openings used to form bumps.

The embodiments of the invention can prevent the bumps on the semiconductor chips from sticking to probe needles in a probe inspection and coming off from the semiconductor chips.

DETAILED DESCRIPTION

Embodiments of the present invention will be described below with reference to the drawings. Through all the drawings, like components are denoted by like numerals and will not be further explained.

First Embodiment

Figure 1:
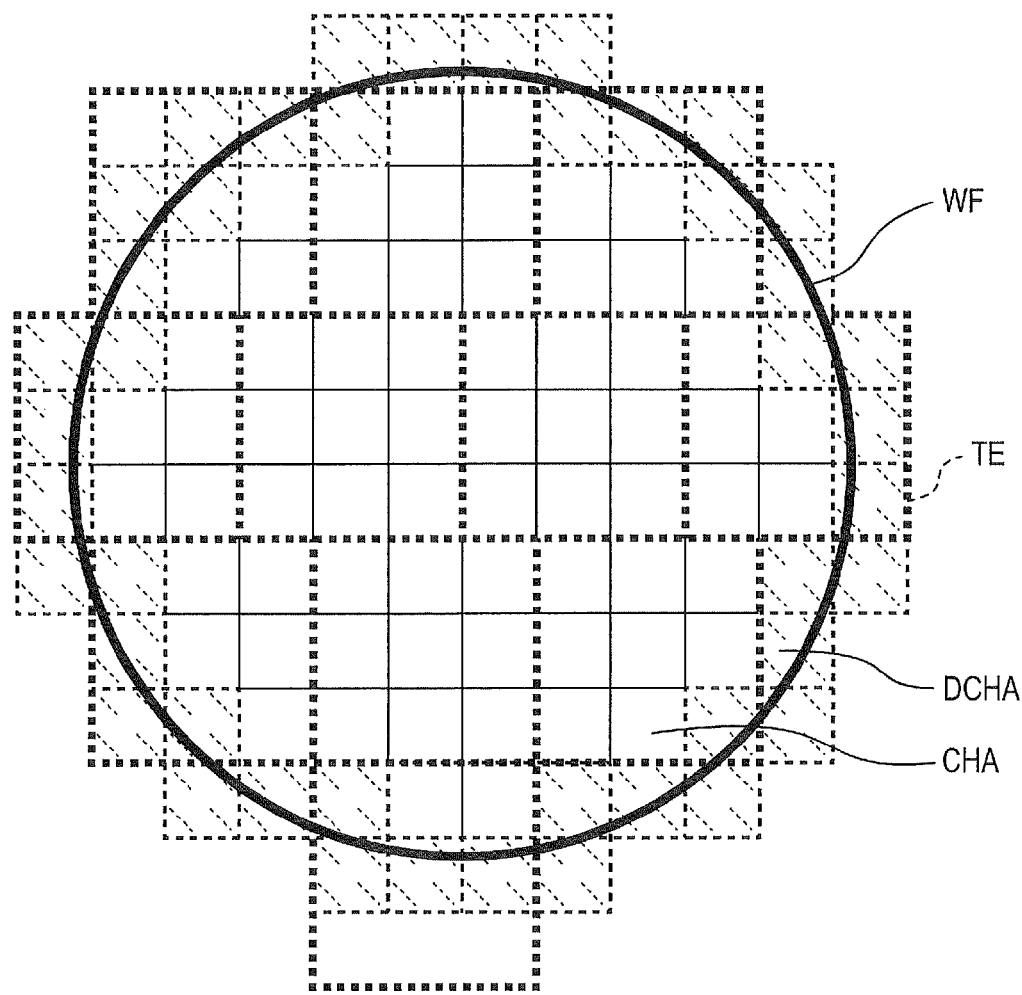
FIG. 1 is a view to explain a part of a method of manufacturing a semiconductor device according to the first embodiment.

FIG. 1 is a view to explain a part of a method of manufacturing a semiconductor device according to the first embodiment. FIG. 1 illustrates steps of inspecting semiconductor chips in the form of a wafer WF. In this example shown in FIG. 1, a plurality of semiconductor chips are subjected to an inspection at once to enhance inspection efficiency. Specifically, semiconductor chips belonging to the same test area TE are simultaneously inspected. The central area of the wafer includes effective areas CHA that are turned into commercially available semiconductor chips, while the peripheral edge portion of the wafer includes non-effective areas DCHA that are turned into commercially unavailable semiconductor chips.

The size of the test area TE uniquely varies from one probe card to another that is used for the inspection test. Because of this, when effective areas CHA positioned relatively on the outer side of the wafer WF are inspected, probe needles of a probe card make contact with not only the effective areas CHA, but also non-effective areas DCHA.

Figure 2:
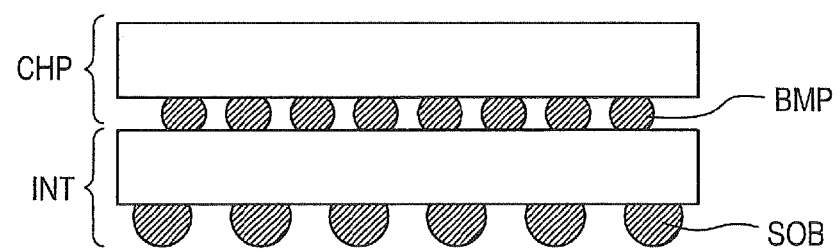
FIG. 2 illustrates an example of a semiconductor package with a semiconductor chip that is cut out from a wafer.

FIG. 2 illustrates an example of a semiconductor package with a semiconductor chip CHP that has been cut out from a wafer WF. In the example shown in FIG. 2, the semiconductor chip CHP is mounted over a surface of an wiring substrate INT in a flip chip method. The semiconductor chip CHP and the wiring substrate INT are coupled with bumps BMP interposed therebetween. On a surface, which is positioned opposite to the semiconductor chip CHP, of the wiring substrate INT, solder balls SOB are provided. The solder balls SOB and bumps BMP are mutually coupled with wiring in the wiring substrate INT.

Figure 3:
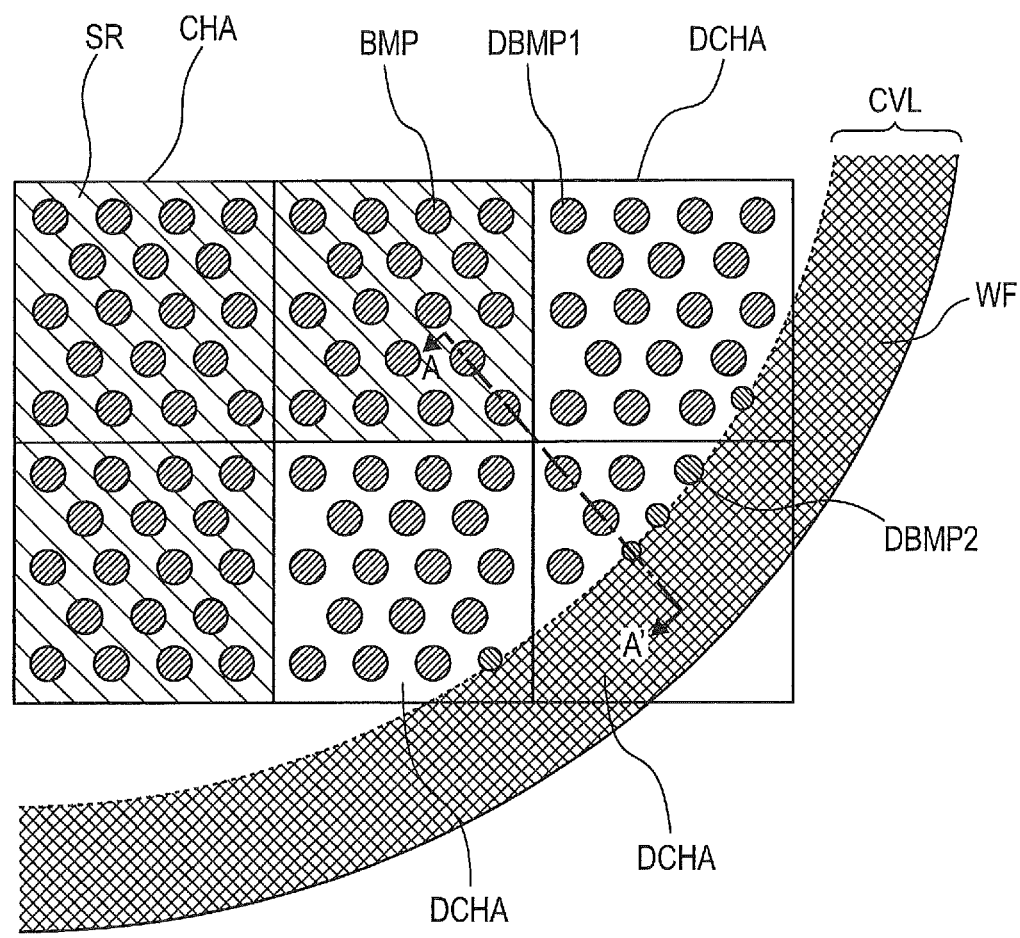
FIG. 3 is an enlarged view of FIG. 1.

FIG. 3 is an enlarged view of FIG. 1. In effective areas CHA of the wafer WF, a plurality of bumps BMP (first bumps) are formed. The bumps BMP are formed on an active surface side of the semiconductor chips. In non-effective areas DOHA of the wafer WF, a plurality of dummy bumps DBMP1 are formed. The layout of the dummy bumps DBMP1 in the non-effective areas DCHA are identical to the layout of the bumps BMP in the effective areas CHA. Among the dummy bumps DBMP1, some bumps positioned at the outermost circumference are dummy bumps DBMP2 (second bumps), which are smaller than the other bumps. The dummy bumps DBMP2 intersect the inner peripheral edge of a light-shielding member CVL as viewed in a plan view. The light-shielding member CVL is used during steps of forming the bumps BMP, dummy bumps DBMP1, and dummy bumps DBMP2, which will be described later.

Figure 4:
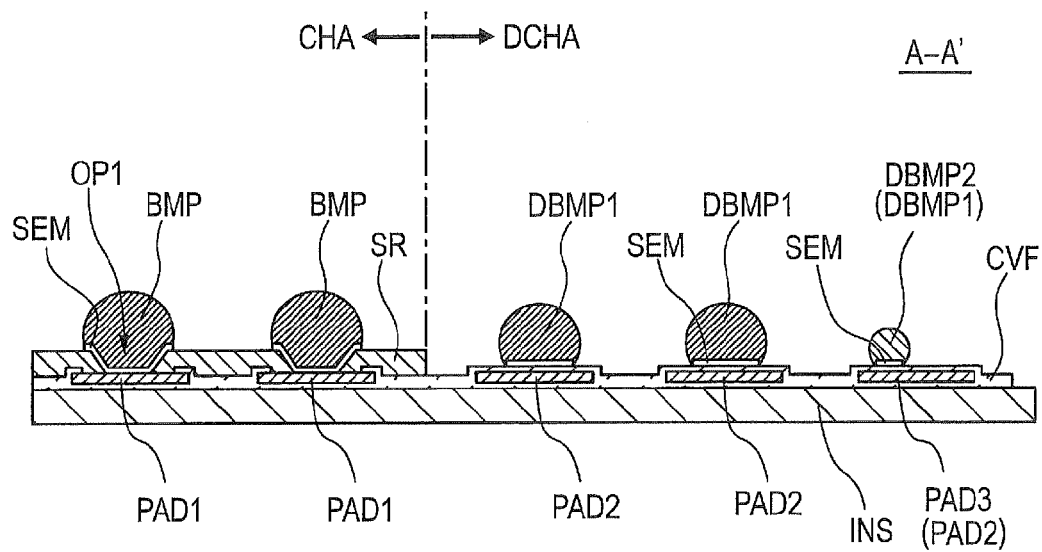
FIG. 4 is a cross-sectional view taken along the line A-A' of FIG. 3.

FIG. 4 is a cross-sectional view taken along the line A-A' of FIG. 3. There is a plurality of first pad electrodes PAD1 in an effective area CHA. There is a plurality of second pad electrodes PAD2 in a non-effective area DCHA. Both the first pad electrodes PAD1 and second pad electrodes PAD2 are formed over the uppermost layer of an interlayer insulating film INS. A protective insulating film CVF is formed on the first pad electrodes PAD1, the second pad electrodes PAD2, and the interlayer insulating film INS. The protective insulating film CVF is made of, for example, SiON or $SiO_2$ and has openings formed therein. These openings are positioned over the first pad electrodes PAD1. In the example shown in FIG. 4, the protective insulating film CVF has no openings positioned over the second pad electrodes PAD2.

In the effective area CHA, a bump-formation insulating film SR, which is used to form bumps, is formed over the protective insulating film CVF and the first pad electrodes PAD1. The bump-formation insulating film SR is a polyimide film, for example. The bump-formation insulating film SR is not formed over the entire third pad electrode PAD3. In the example shown in FIG. 4, the bump-formation insulating film SR is removed from the entire non-effective area DCHA.

The bump-formation insulating film SR has first openings OP1 formed therein. The first openings OP1 are positioned over the first pad electrodes PAD1. Seed metal films SEM are formed at the bottom and on the sidewall of the first openings OP1. A part of the seed metal film SEM positioned at the bottom of the first opening OP1 is coupled with the first pad electrodes PAD1. A bump BMP is formed over the seed metal film SEM. The seed metal film SEM functions as a seat for the bump BMP to grow by plating.

In addition, seed metal films SEM are also formed over the protective insulating film CVF, but only over the second pad electrodes PAD2. On the seed metal films SEM, dummy bumps DBMP1 are formed. Among the second pad electrodes PAD2, the outermost pad electrode is a third pad electrode PAD3, and the dummy bump DBMP1 over the third pad electrode PAD3 is referred to as a dummy bump DBMP2. The dummy bumps DBMP1 except for the dummy bumps DBMP2 are roughly the same size as the bumps BMP. On the other hand, the dummy bump DBMP2 is smaller than the bumps BMP. The seed metal film SEM positioned under the dummy bump DBMP2 is also smaller than the seed metal films SEM positioned under the bumps BMP.

If the dummy bumps DBMP1, DBMP2 are not formed, the outermost effective areas CHA can possibly have a different current density from that of the other effective areas CHA during electroplating to form the bumps. The current density variations provide bumps BMP of abnormal size in the outermost effective areas CHA.

Figure 5:
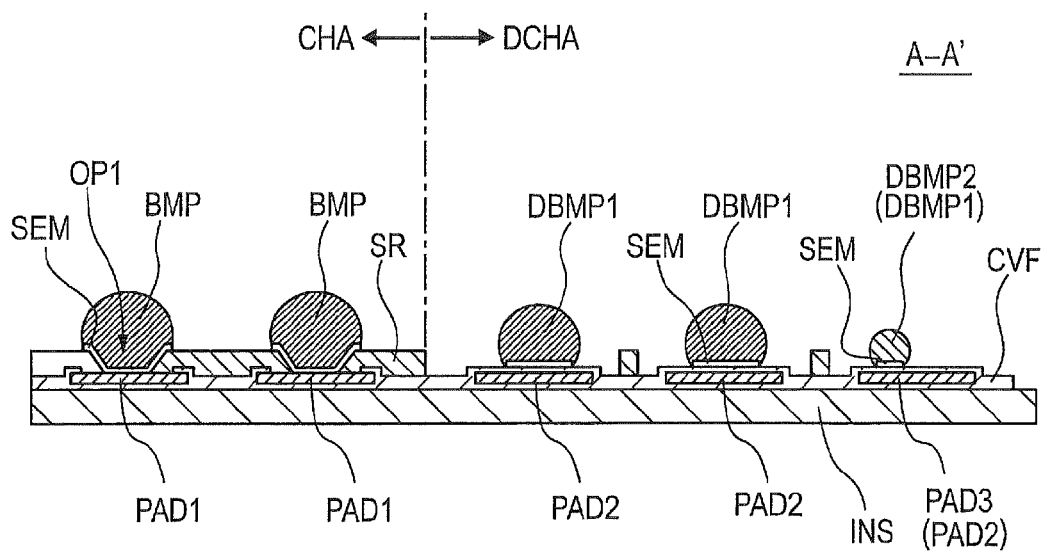
FIG. 5 depicts a modification of FIG. 4.

The dummy bump DBMP2 is formed over a flat area of the protective insulating film CVF. To do this, as described above, it is preferable to remove the bump-formation insulating film SR over the entire third pad electrode PAD3. It is more preferable to remove the bump-formation insulating film SR also around the third pad electrode PAD3. For example, the minimum range of the bump-formation insulating film SR to be removed is defined as follows: when the diameter of a bump BMP is 1, the range extends a distance of 0.5×1 from the edge of the third pad electrode PAD3. By the definition, some parts of the bump-formation insulating film SR may remain between the second pad electrodes PAD2 (including space between the second pad electrode PAD2 and the third pad electrode PAD3) as shown in FIG. 5.

Figure 6:
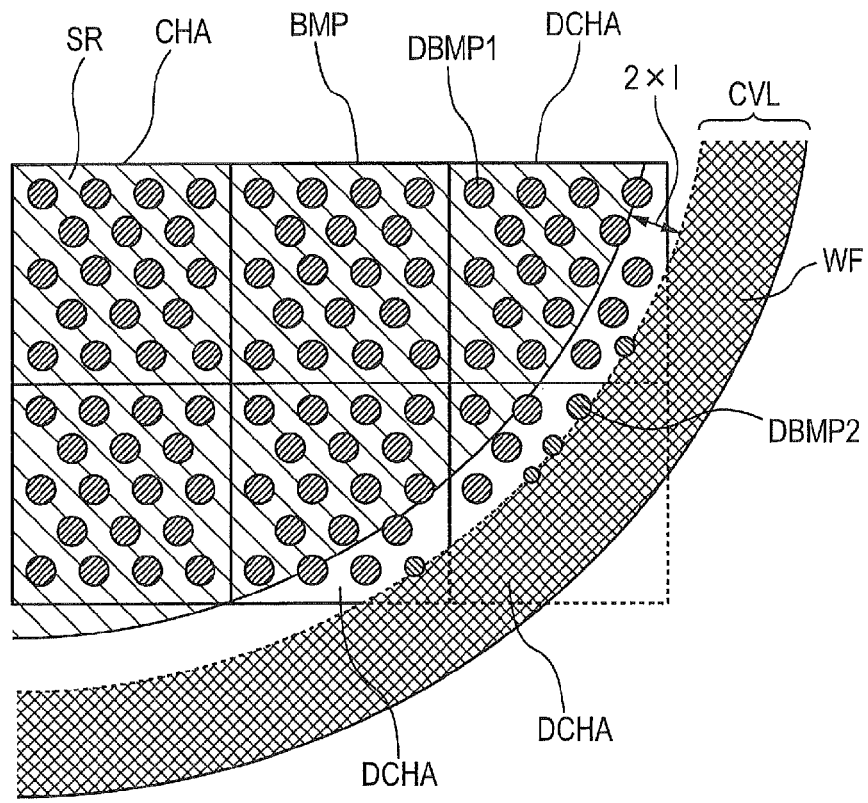
FIG. 6 depicts a modification of FIG. 3.
Figure 7:
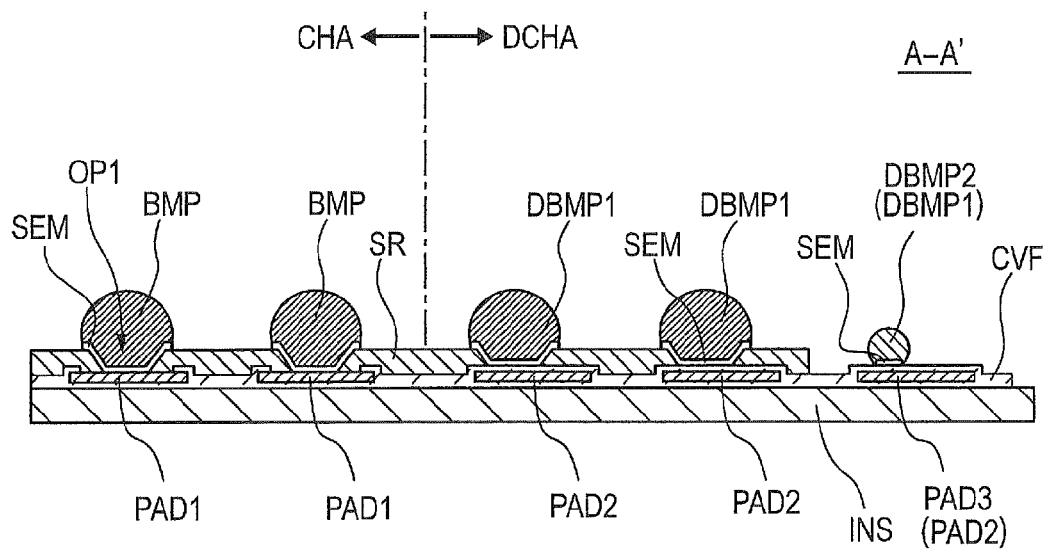
FIG. 7 is a cross-sectional view taken along the line A-A' of FIG. 6.

In addition, as shown in FIG. 6 and a cross-sectional view taken along the line A-A' in FIG. 7, the minimum range of the bump-formation insulating film SR to be removed can be defined as, for example, a range between the inner peripheral edge of the light-shielding member CVL and a line positioned 1×2 inward from the inner peripheral edge. In this case, the bump-formation insulating film SR remains below some of the dummy bumps DBMP1.

Figure 8A:
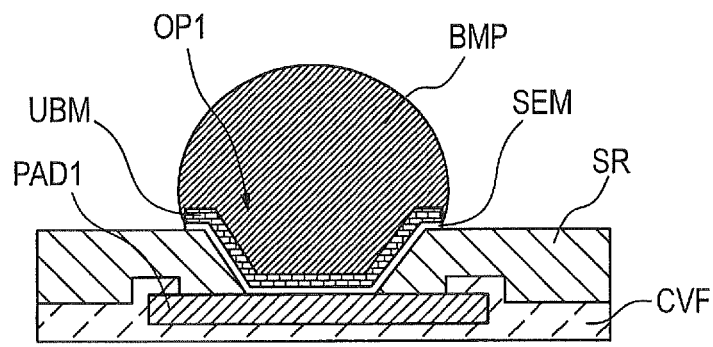
FIG. 8A is an enlarged view of the structure of a bump.
Figure 8B:
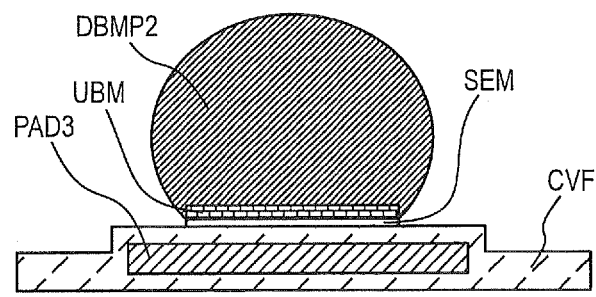
FIG. 8B is an enlarged view of the structure of a dummy bump.

FIG. 8A is an enlarged view of the structure of a bump BMP. FIG. 8B is an enlarged view of the structure of a dummy bump DBMP2. As described above, the protective insulating film CVF has an opening positioned over a first pad electrode PAD1, but has no opening positioned over a third pad electrode PAD3. In addition, both the bump BMP and dummy bump DBMP2 are formed on an under bump metal UBM. If the bump BMP and dummy bump DBMP2 are made of SnAg, the material of the under bump metal UBM is, for example, Ni.

Figure 9:
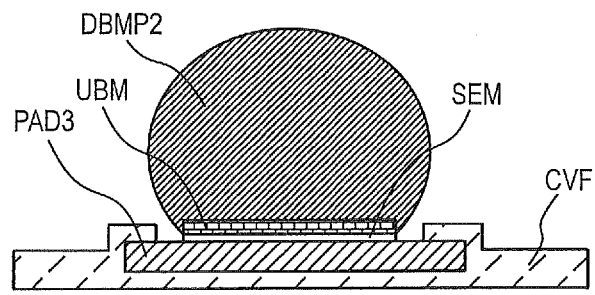
FIG. 9 depicts a modification of the dummy bump.

FIG. 9 depicts a modification of the dummy bump DBMP2. In the modification of FIG. 9, a protective insulating film CVF has an opening positioned over the third pad electrode PAD3. A seed metal film SEM, an under bump metal UBM, and a dummy bump DBMP2 are formed over the third pad electrode PAD3. The dummy bump DBMP1 can be formed in the same manner as shown in FIG. 9.

Figure 10A:
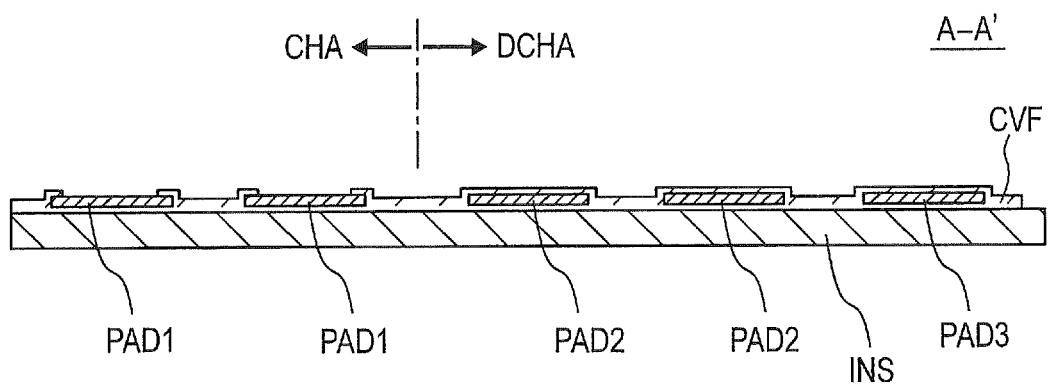
FIGS. 10A and 10B are cross-sectional views illustrating the method of manufacturing the semiconductor device.

FIGS. 10A and 10B, FIGS. 11A and 11B, FIG. 12, and FIG. 13 are cross-sectional views illustrating a method of manufacturing the aforementioned semiconductor device. First, a wafer WF as shown in FIG. 10A is prepared. This wafer WF has a transistor (not shown) and multiple wire layers. The top layer of the multiple wire layers is an interlayer insulating film INS over which first pad electrodes PAD1, second pad electrodes PAD2, and a third pad electrode PAD3 are formed. The wafer in the state shown in FIG. 10A is formed as follows.

First, a device isolation film (not shown) is formed over the wafer WF. The wafer WF is, for example, a Si wafer. The device isolation film formed over the Si wafer separates device formation areas. The device isolation films are formed by, for example, an STI (Shallow Trench Isolation) method, but a LOCOS (Local Oxidation of Silicon) method can also be used. Then, a gate insulating film and a gate electrode are formed over a semiconductor substrate positioned in the device formation area. The gate insulating film may be an oxide silicon film, or a high dielectric film (e.g., hafnium silicate film) having a higher dielectric constant than the oxide silicon film. If the gate insulating film is an oxide silicon film, the gate electrode is made of a polysilicon film. If the gate insulating film is a high dielectric film, the gate electrode is made of a laminate film of a metal film (e.g., TiN) and a polysilicon film. In addition, if the gate electrode is made of polysilicon, a polysilicon resistance can be formed over the device isolation film during a step of forming the gate electrode.

Subsequently, a source/drain extension region is formed over the semiconductor substrate positioned in the device formation area. Then, a sidewall is formed on the side wall of the gate electrode. Then, an impurity region, which will be a source and a drain, is formed over the semiconductor substrate positioned in the device formation area. In this manner, a MOS transistor is formed over the semiconductor substrate.

Next, multiple wire layers are formed over the device isolation film and MOS transistor. Over the top layer of the multiple wire layers, first pad electrodes PAD1, second pad electrodes PAD2, and a third pad electrode PADS are formed. Then, a protective insulating film CVF is formed over the top of the multiple wire layers. The protective insulating film CVF has openings over the first pad electrodes PAD1.

Figure 10B:
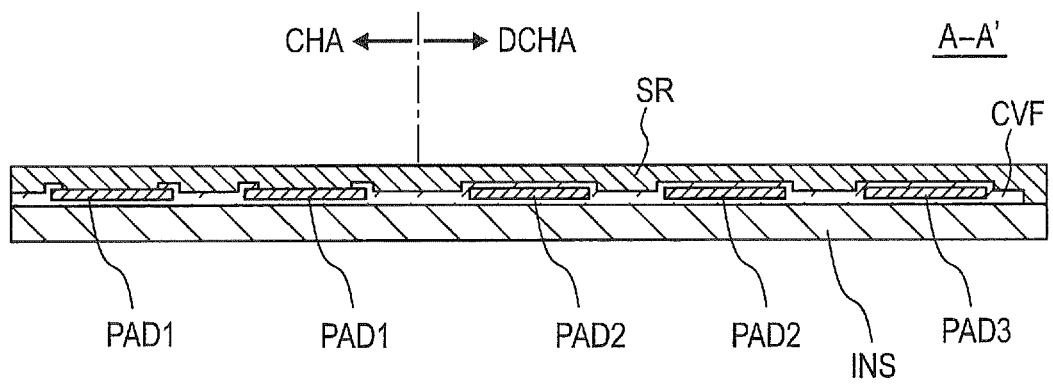

Next, as shown in FIG. 10B, a bump-formation insulating film SR is formed over the protective insulating film CVF by, for example, a spin coat method. In this step, the bump-formation insulating film SR is formed over both effective areas CHA and non-effective areas DOHA.

Figure 11A:
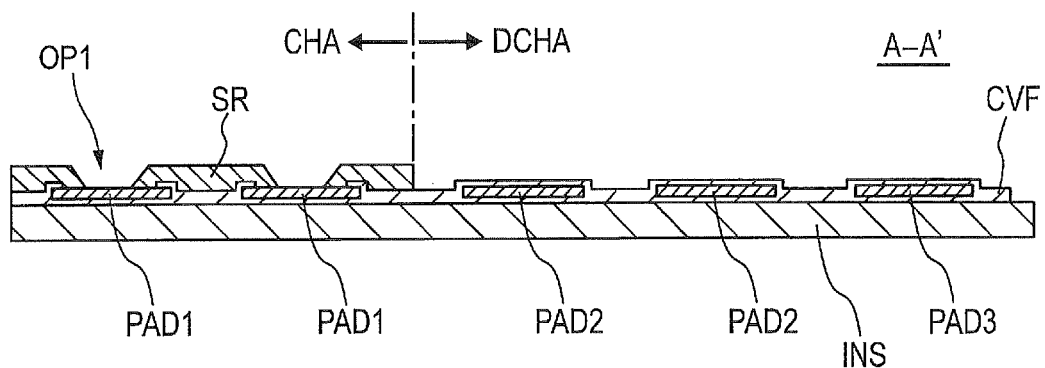
FIGS. 11A and 11B are cross-sectional views illustrating the method of manufacturing the semiconductor device.

Next, as shown in FIG. 11A, the bump-formation insulating film SR is exposed to light and developed. Through this step, a first opening OP1 is formed in the bump-formation insulating film SR within the effective area CHA. On the other hand, the bump-formation insulating film SR in the non-effective area DCHA is removed. For example, if the bump-formation insulating film SR is a positive type, portions of the bump-formation insulating film SR to be removed are exposed to light. Specifically, portions of the bump-formation insulating film SR to be the first openings OP1 are exposed to light with a first reticle. Portions of the bump-formation insulating film SR to be removed in the non-effective area DCHA are exposed to light with a second reticle. If the bump-formation insulating film SR is a negative type, portions of the bump-formation insulating film SR not to be removed are exposed to light. In this case, the removal can be carried out with a single reticle, for example.

In this step, there is no problem to partially remove the bump-formation insulating film SR in the non-effective area DCHA. In this case, as described above, it is preferable to remove the bump-formation insulating film SR from over the entire third pad electrode PAD3. It is more preferable to remove the bump-formation insulating film SR also around the third pad electrode PAD3. For example, the minimum range of the bump-formation insulating film SR to be removed is defined as follows: when the diameter of a bump BMP is 1, the range extends a distance 0.5×1 from the edge of the third pad electrode PAD3. Alternatively, the minimum range of the bump-formation insulating film SR to be removed can be defined as, for example, a range between the inner peripheral edge of the light-shielding member CVL and a line positioned 1×2 inward from the inner peripheral edge.

Figure 11B:
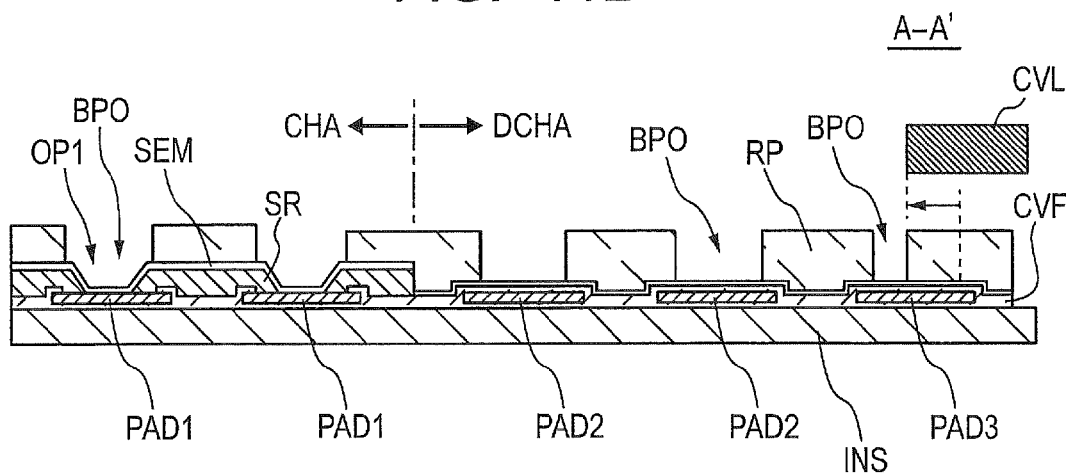

As shown in FIG. 11B, a seed metal film SEM is continuously formed over the bump-formation insulating film SR in the effective area CHA, on the side wall and bottom of the first openings OP1, and over the protective insulating film CVF in the non-effective area DCHA. The seed metal film SEM is formed by, for example, a sputtering method.

Next, a photosensitive film RP is formed over the seed metal film SEM. Then, the photosensitive film RP is exposed to light and developed. This step forms bump-formation openings BPO in the photosensitive film RP. The bump-formation openings BPO are formed over the first pad electrodes PAD1, second pad electrodes PAD2, and third pad electrode PAD3. The seed metal film SEM is exposed at the bottoms of the bump-formation openings BPO.

If the bump-formation insulating film SR in the non-effective areas DCHA is partially removed, the bump-formation insulating film SR should not be exposed from the bump-formation opening BPO over the third pad electrode PAD3. A measure to prevent exposure of the bump-formation insulating film SR is to define an appropriate removal range of the bump-formation insulating film SR at the stage of exposure and development of the bump-formation insulating film SR.

In this step, light used for exposure is partially blocked by a light-shielding member CVL. The light-shielding member CVL covers the peripheral edge of the wafer WF to block the wafer WF below thereof from light. The inner edge of the light-shielding member CVL intersects the third pad electrode PAD3. Because the photosensitive film RP is a positive type, the bump-formation opening BPO over the third pad electrode PAD3 is formed smaller than the other bump-formation openings BPO.

Figure 12:
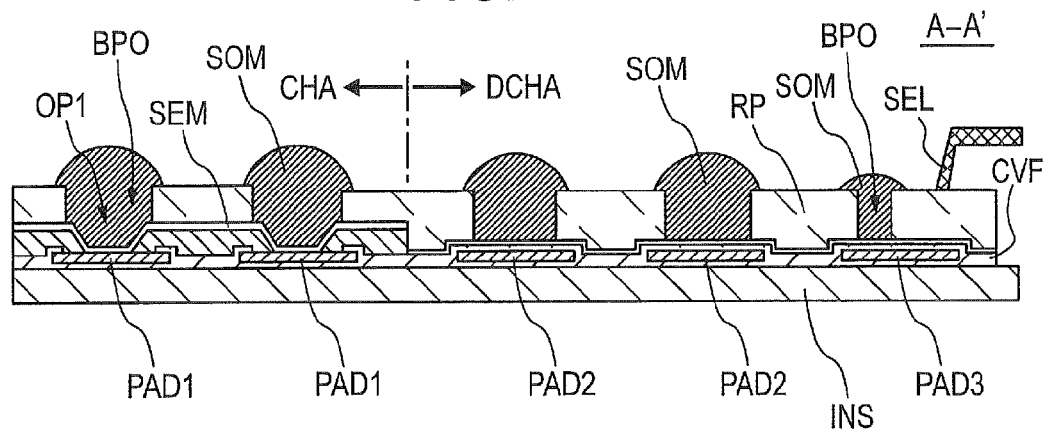
FIG. 12 is a cross-sectional view illustrating the method of manufacturing the semiconductor device.

As shown in FIG. 12, a sealing member SEL is applied so as to prevent a plating solution from adhering to the peripheral edge of the wafer WF. Then, the wafer WF is immersed in the plating solution while electricity is supplied to the seed metal film SEM. Through this step, solder layers SOM grow over the seed metal film SEM at the bottom of the bump-formation openings BPO. Since the bump-formation opening BPO over the third pad electrode PAD3 is smaller than the other bump-formation openings BPO as described above, the solder layer SOM over the third pad electrode PAD3 is smaller than the other solder layers SOM.

Next, the photosensitive film RP is removed and the solder layers SOM are reflowed. Thus, bumps BMP, dummy bumps DBMP1, and a dummy bump DBMP2 are formed as shown in FIG. 4. Because the solder layer SOM over the third pad electrode PAD3 is smaller than the other solder layers SOM as described above, the dummy bump DBMP2 is naturally smaller than the other bumps. However, because the bump-formation insulating film SR is removed from the non-effective area DCHA, the dummy bump DBMP2 and the lower surface of the seed metal film SEM make contact with only a flat part of the protective insulating film CVF.

Figure 13:
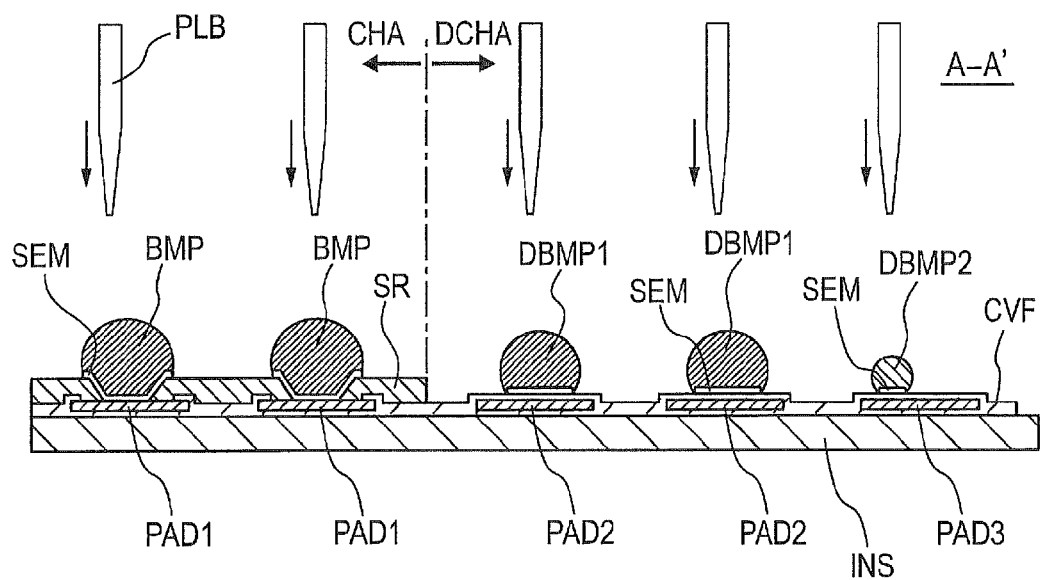
FIG. 13 is a cross-sectional view illustrating the method of manufacturing the semiconductor device.

After that, as shown in FIG. 13, probe needles PLB are brought to touch the bumps BMP to inspect the semiconductor chip CHP in the effective area CHA. In this step, the probe needles PLB also touch the dummy bumps DBMP1 and dummy bumps DBMP2.

After the inspection, the wafer WF is diced to separate the semiconductor chips CHP.

Figure 14A:
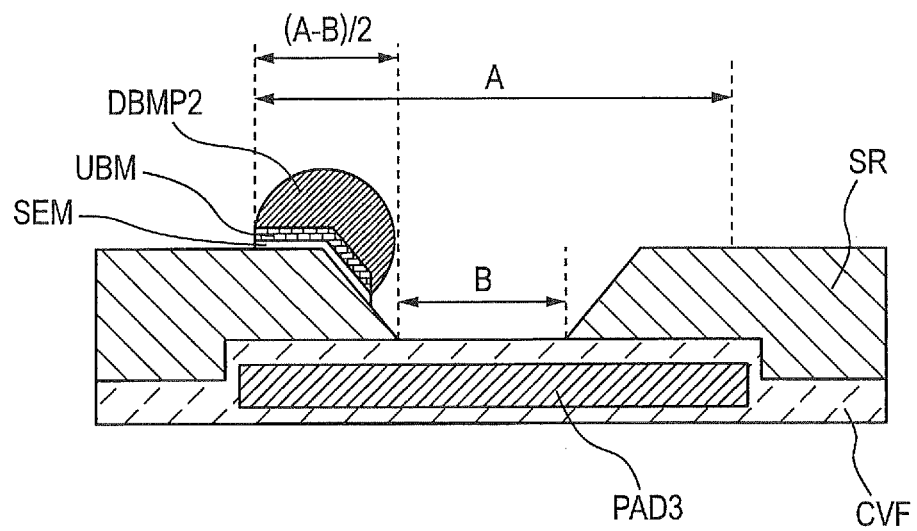
FIGS. 14A and 14B illustrate the action and effect of the first embodiment.
Figure 14B:
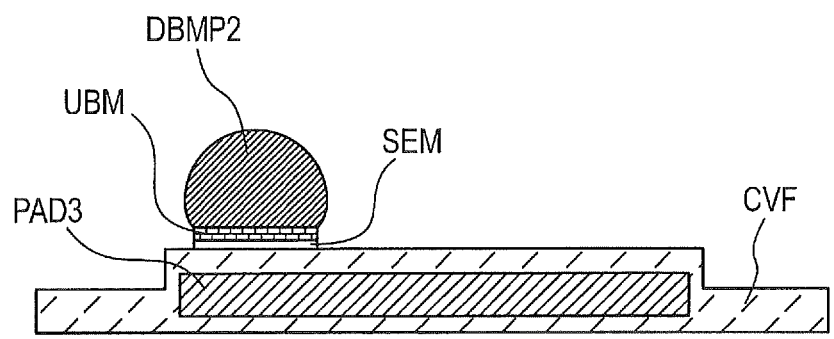

With reference to FIGS. 14A and 14B, the action and effect of the embodiment will be described. FIG. 14A illustrates the layout of a dummy bump DBMP2 according to a comparative example. In the example shown in FIG. 14A, the bump-formation insulating film SR remains also in the area over the third pad electrode PAD3 and has an opening over the third pad electrode PAD3. In this case, the dummy bump DBMP2 may be sometimes formed across the edge of the opening in the bump-formation insulating film SR. In this case, when a probe needle PLB is pulled up, the lower surface portion of the seed metal film SEM that is positioned at the edge of the opening in the bump-formation insulating film SR tends to start peeling off. Accordingly, the dummy bump DBMP2 of the comparative example shown in FIG. 14A is easy to stick to the probe needle PLB. When the diameter of the bumps BMP in the effective areas CHA is A and the diameter of the bottom of the openings in the bump-formation insulating film SR is B, the diameter of the dummy bumps DBMP2 shown in FIGS. 14A and 14B is (A−B)/2 or less.

On the contrary, as shown in the embodiment of FIG. 14B, the bump-formation insulating film SR is removed from at least the area over the third pad electrode PAD3. Because of this, the lower surface of the seed metal film SEM does not have portions that may be easy to start peeling off. Thus, the dummy bumps DBMP2 is hard to stick to the probe needle PLB.

Second Embodiment

Figure 15:
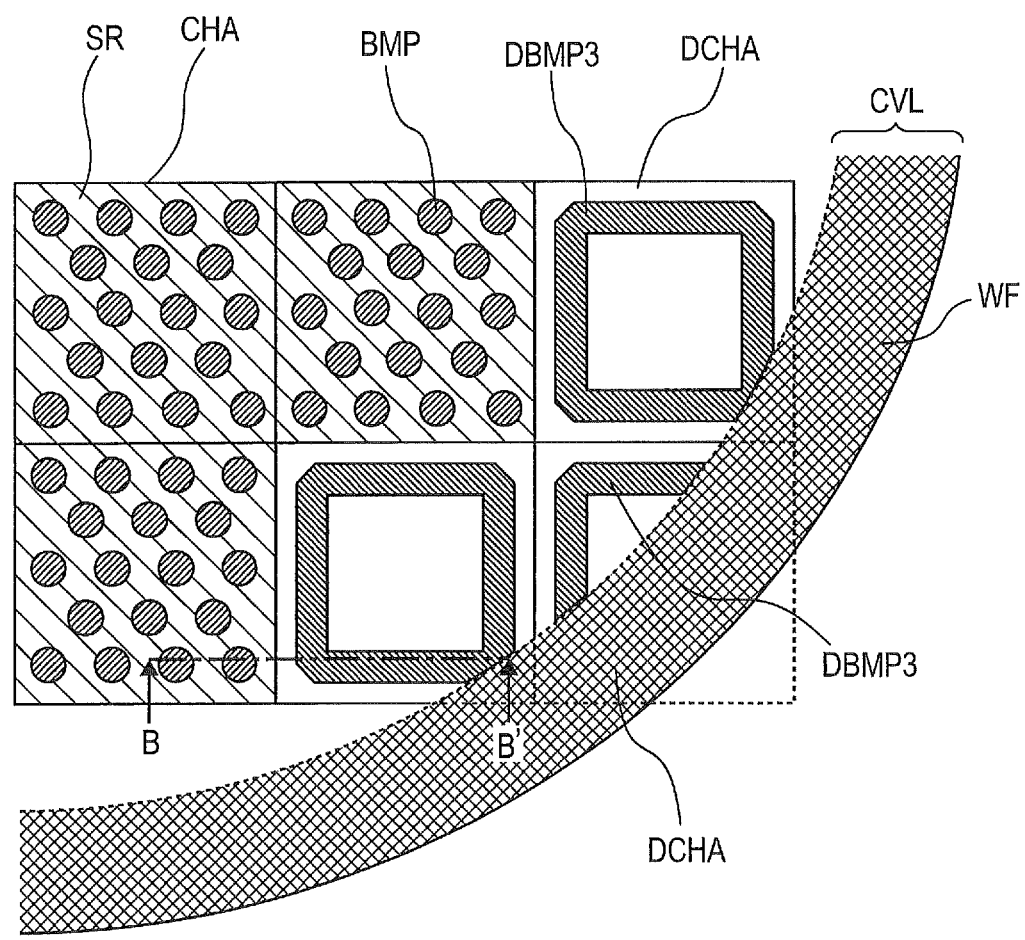
FIG. 15 is a plan view showing a relevant part of a wafer WF to explain a method of manufacturing a semiconductor device according to the second embodiment.

FIG. 15 is a plan view showing a relevant part of a wafer WF to explain a method of manufacturing a semiconductor device according to the second embodiment. The method of manufacturing the semiconductor device according to the second embodiment is the same as that of the first embodiment except for the shape of bumps formed in non-effective areas DOHA.

In the second embodiment, dummy bumps DBMP3 are formed in non-effective areas DCHA. Each of the dummy bumps DBMP3 is in the shape of a frame. In other words, the dummy bumps DBMP3 have a hollow. When a dummy bump DBMP3 is viewed in a plan view, the dummy bump DBMP3 is larger in area than a bump BMP. In the example shown in FIG. 15, the dummy bumps DBMP3 are formed along the edges of the non-effective areas DCHA.

If the dummy bumps DBMP3 do not have an appropriate area, the outermost effective areas CHA may have a different current density from the other effective areas CHA during electroplating to form the bumps. The current density variations may provide bumps BMP of abnormal size in the outermost effective areas CHA. For example, if the dummy bumps DBMP3 are formed into a solid pattern, the bump BMP in the outermost effective areas CHA may become too small.

Figure 16:
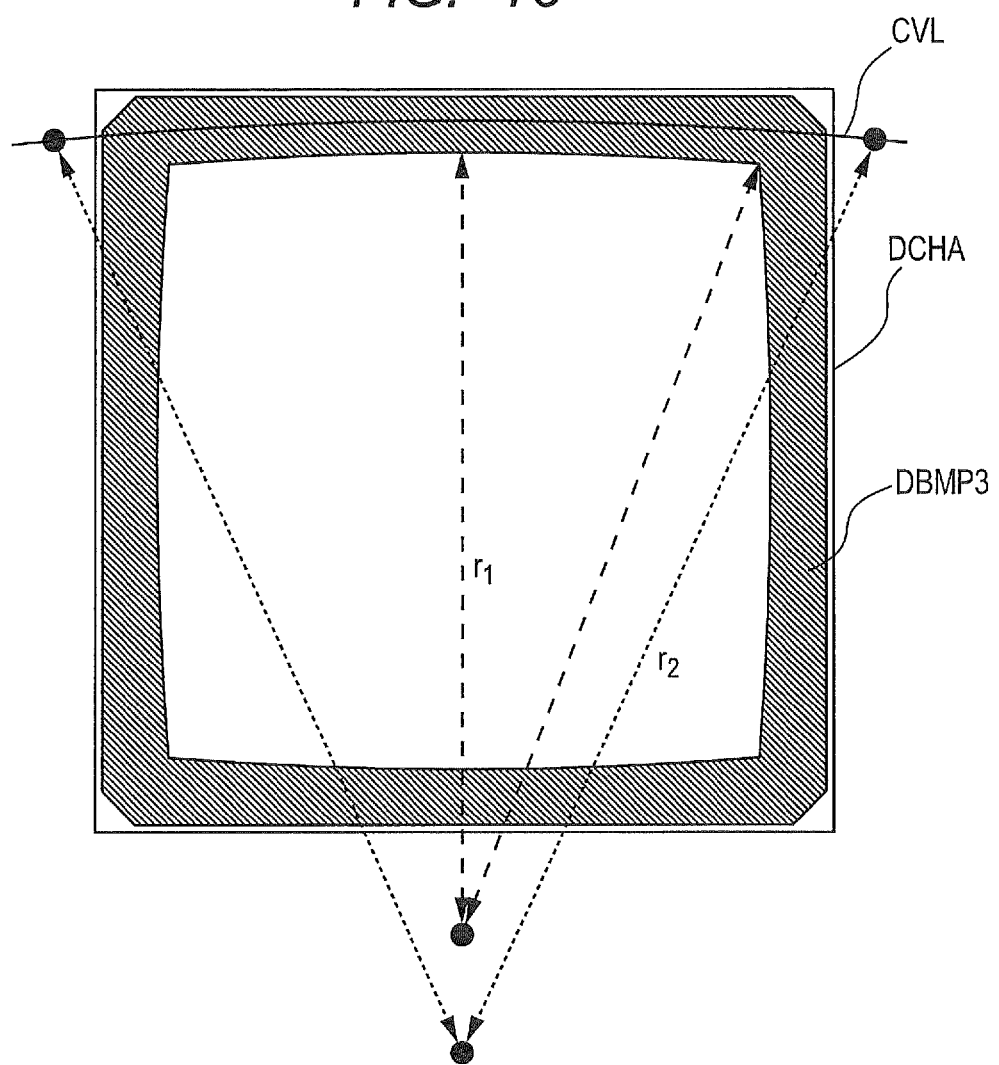
FIG. 16 is an enlarged view of one of the non-effective areas DCHA shown in FIG. 15.

FIG. 16 is an enlarged view of one of the non-effective areas DCHA shown in FIG. 15. In this example shown in FIG. 16, the non-effective area DCHA is a rectangle in a plane. The dummy bump DBMP3 is formed along the four sides (edges) of the non-effective area DOHA and has inner sides curved toward the inside of the dummy bump DBMP3. The light-shielding member CVL has also an inner side curved toward the inside of the light-shielding member CVL as shown in FIG. 15. The radius of curvature $r_1$ of the inner sides of the dummy bump DBMP3 is smaller than the radius of curvature $r_2$ of the inner side of the light-shielding member CVL.

Figure 17:
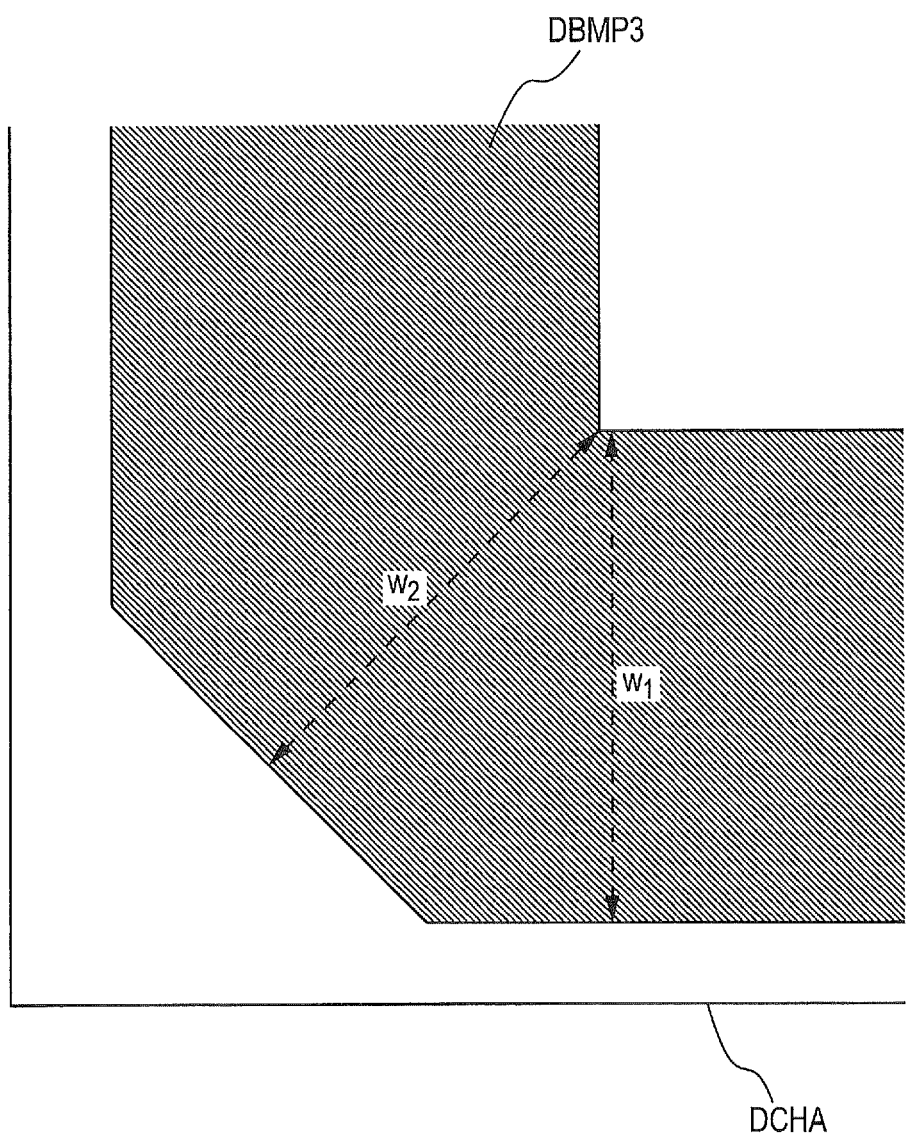
FIG. 17 is an enlarged view of a corner of the non-effective area DOHA shown in FIG. 16.

FIG. 17 is an enlarged view of a corner of the non-effective area DCHA shown in FIG. 16. The dummy bump DBMP3 has a width $w_2$ in portions diagonally facing corners of the non-effective area DCHA and has a width $w_1$ in portions along with the four sides of the non-effective area DCHA, the width $w_2$ being wider than the width $w_1$.

Figure 18A:
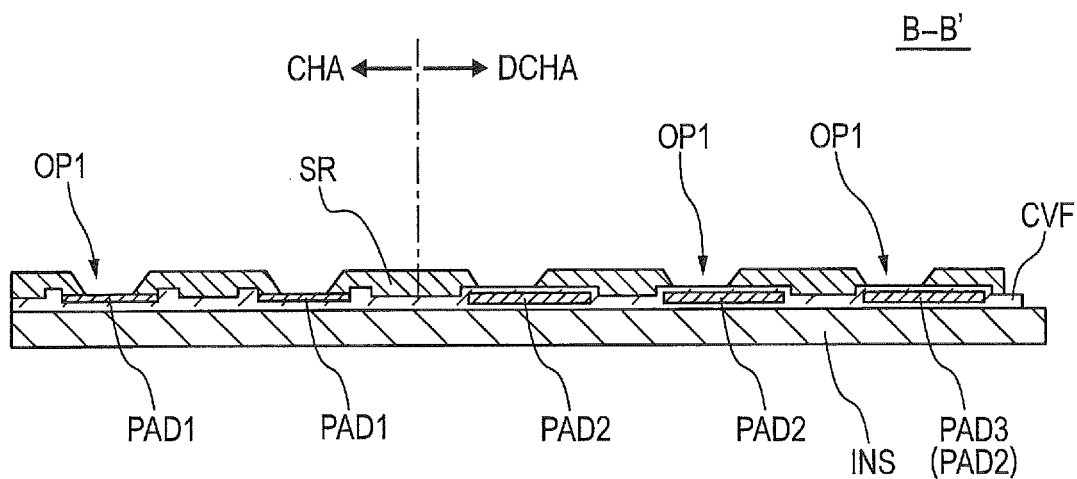
FIGS. 18A and 18B are cross-sectional views illustrating the method of manufacturing the semiconductor device according to the second embodiment.
Figure 18B:
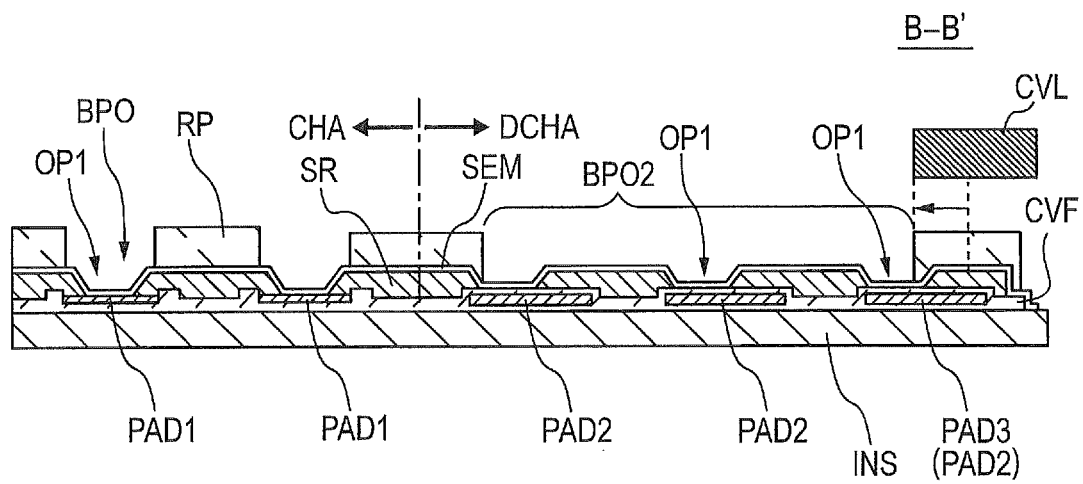
Figure 19:
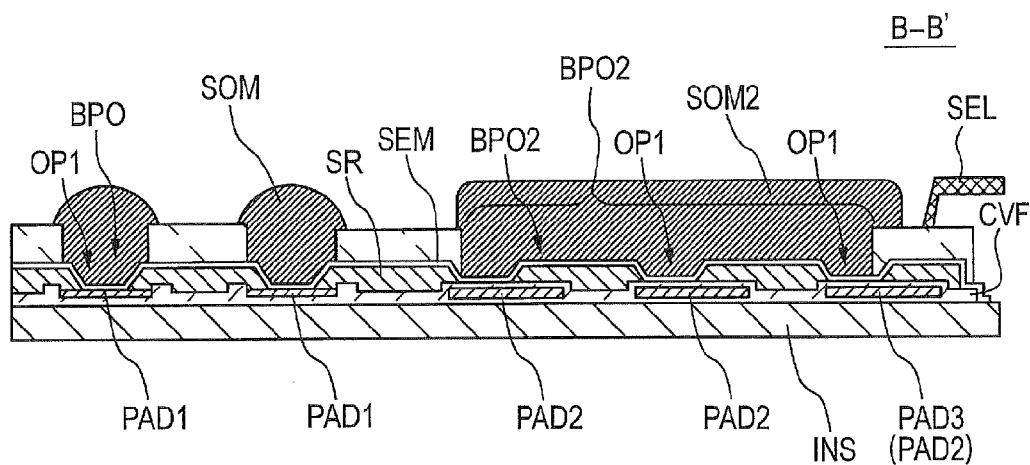
FIG. 19 is a cross-sectional view illustrating the method of manufacturing the semiconductor device according to the second embodiment.

FIGS. 18A, 18B and FIG. 19 are cross-sectional views illustrating the method of manufacturing the semiconductor device according to the second embodiment. These drawings depict cross sections taken along the line B-B' in FIG. 15. The method of manufacturing the semiconductor device according to the second embodiment has the same steps from the beginning to the step of forming the bump-formation insulating film SR as the first embodiment. After forming the bump-formation insulating film SR, as shown in FIG. 18A, the bump-formation insulating film SR is exposed to light and developed. Through the step, first openings OP1 are formed in the bump-formation insulating film SR over the first pad electrodes PAD1. In the second embodiment, the first openings OP1 are also formed over the second pad electrodes PAD2 and third pad electrodes PADS.

Then, as shown in FIG. 18B, a seed metal film SEM is continuously formed on the bump-formation insulating film SR and inner walls and bottoms of the first openings OP1. Then, a photosensitive film RP is formed on the seed metal film SEM and then is exposed to light and developed. Through these steps, bump-formation openings BPO are formed in the photosensitive film RP. In addition, a dummy-formation opening BPO2, which is used to form a dummy bump, is formed in the photosensitive film RP in the non-effective area DOHA. In this exposure step, a first reticle to form the bump-formation openings BPO and a second reticle to form the dummy-formation opening BPO2 are used. The seed metal film SEM is exposed from both the bottoms of the bump-formation openings BPO and the bottom of the dummy-formation opening BPO2. The dummy-formation opening BPO2 is an opening in the shape of a trench used to form the dummy bump DBMP3. The plane shape of the dummy-formation opening BPO2 is the same as the dummy bump DBMP3 shown in FIGS. 15 and 16.

In this exposure step, the light-shielding member CVL covers the peripheral edge of the wafer WF to block the wafer WF below thereof from light. The light-shielding member CVL blocking a part of the area to become the dummy-formation opening BPO2 from light may make the dummy-formation opening BPO2 small. However, because the dummy-formation opening BPO2 is in the shape of a frame, it can be prevented that the dummy-formation opening BPO2 becomes smaller than the bump-formation opening BPO as viewed in a plan view. If the dummy-formation opening BPO2 becomes significantly small, there is no need to form the opening in the exposure step.

After applying a sealing member SEL that prevents a plating solution from sticking to the periphery of the wafer WF as shown in FIG. 19, the wafer WF is immersed in the plating solution while electricity is supplied to the seed metal film SEM. Through this step, solder layers SOM grow on the seed metal film SEM at the bottoms of the bump-formation openings BPO. In addition, a solder layer SOM2 grows on the seed metal film SEM at the bottom of the dummy-formation opening BPO2. Because the dummy-formation opening BPO2 is larger than the bump-formation openings BPO, the solder layer SOM2 has a plane area larger than the solder layer SOM.

Next, the photosensitive film RP is removed and the solder layers SOM, SOM2 are reflowed. Thus, the solder layers SOM turn into bumps BMP, and the solder layer SOM2 turns into a dummy bump DBMP3.

The subsequent steps are the same as those of the first embodiment.

The action and effect of the second embodiment will be described. According to the embodiment, the dummy bump DBMP3 is in the shape of a frame. Therefore, even if the light-shielding member CVL makes the dummy bump DBMP3 small, the dummy bump DBMP3 cannot be smaller than the bumps BMP. Thus, it is possible to prevent the dummy bump DBMP3 and seed metal film SEM from sticking to probe needles PLB.

If a dummy bump DBMP3 is located away from the edges of a non-effective area DOHA, bumps BMP of abnormal size may be formed in an effective area CHA adjacent to the non-effective area DCHA. However, since the dummy bump DBMP3 in this embodiment is formed along the edges of the non-effective area DCHA, the dummy bump DBMP3 does not cause formation of abnormal-size bumps BMP.

The solder layer SOM2 is in the shape of a frame. Although it depends on the shape of the solder layer SOM2, solder layer SOM2 that is melted during reflow step tends to accumulate at the corners of the dummy-formation opening BPO2 due to the surface tension of the melted solder. As a result, the dummy bump DBMP3 becomes too high and probe needles may be damaged by the excessively high dummy bump DBMP3 during probe inspection. On the other hand, the dummy-formation opening BPO2 and dummy bump DBMP3 according to the second embodiment have a width $w_2$ in portions diagonally facing corners of the non-effective area DCHA and have a width $w_1$ in portions along with the four sides of the non-effective area DCHA, the width $w_2$ being wider than the width $w_1$. This design can prevent the melted solder from accumulating at the corners of the dummy-formation opening BPO2, and therefore can reduce formation of abnormally-high dummy bumps DBMP3.

Figure 20:
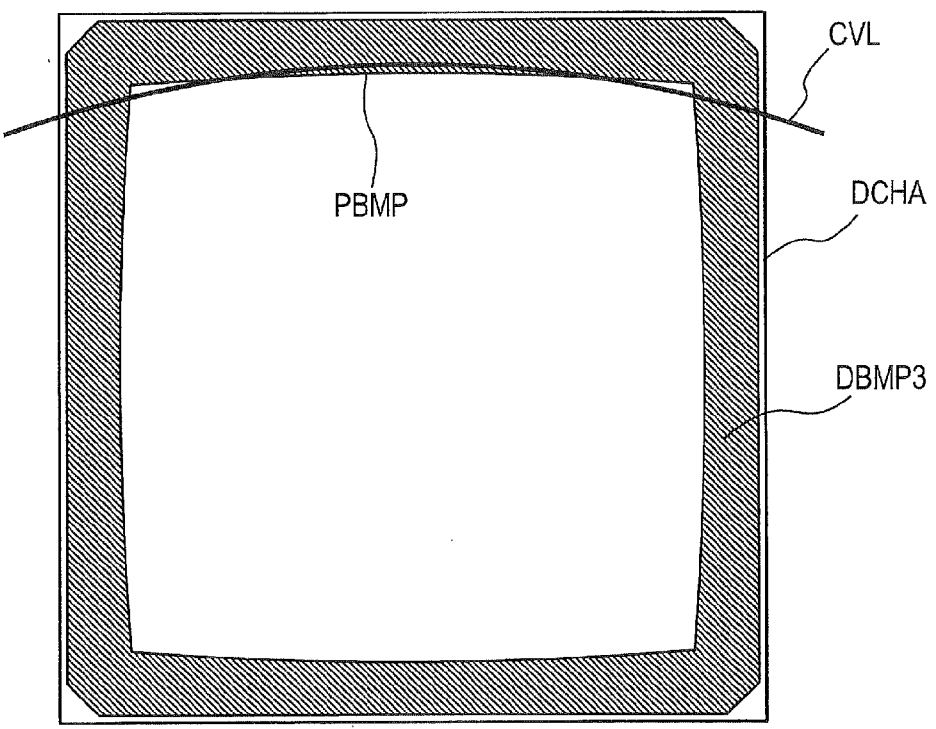
FIG. 20 is an enlarged view of a dummy bump DBMP3 according to the second embodiment.

In addition, as shown in FIG. 20, if the radius of curvature $r_1$ of the inner sides of the dummy bump DBMP3 is larger than the radius of curvature $r_2$ of the inner side of the light-shielding member CVL, a part PBMP, which is supposed to become a dummy bump DBMP3, may be cut off by the light-shielding member CVL. In this case, the cut off part PBMP may result in a small bump. On the other hand, since the radius of curvature $r_1$ of the inner sides of the dummy bump DBMP3 in the second embodiment is smaller than the radius of curvature $r_2$ of the inner side of the light-shielding member CVL, the part PBMP that is to be the dummy bump DBMP3 is not cut off by the light-shielding member CVL.

Figure 21:
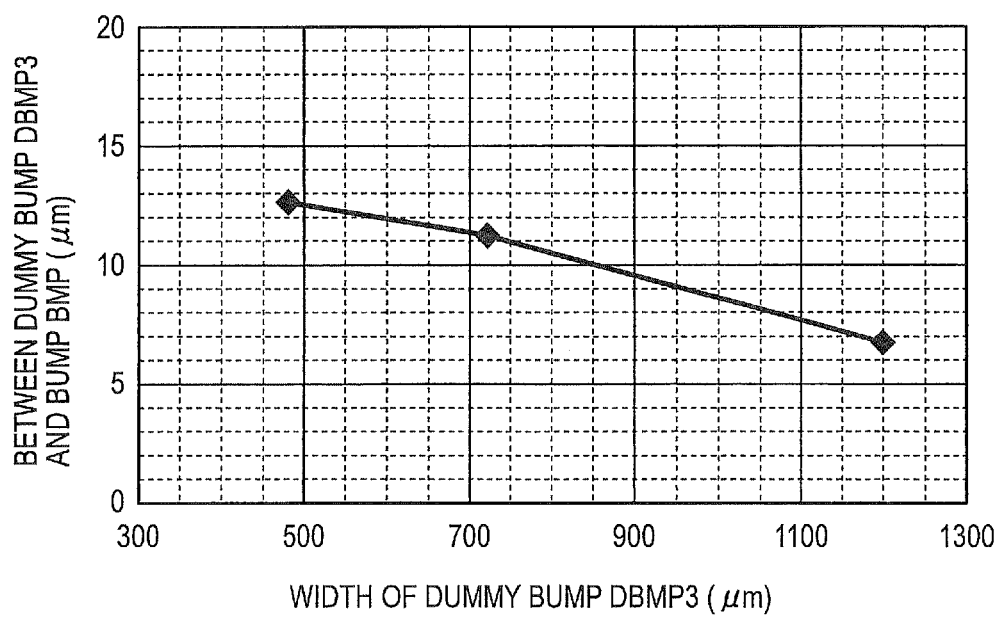
FIG. 21 is a graph showing the effect of the second embodiment.

In addition, as shown in FIG. 21, changing the width of the dummy bump DBMP3, or the width of the dummy-formation opening BPO2, can appropriately control the height of the dummy bump DBMP3. Note that adjustment of plating current also sometimes can appropriately control the height of the dummy bump DBMP3.

EXAMPLE

A semiconductor device is manufactured by the method described in the first embodiment (Example 1). In addition, a semiconductor device is manufactured with a bump-formation insulating film SR that remains in the non-effective area DCHA as well as a bump-formation insulating film SR in the effective area CHA as a comparative example (Comparative Example 1). The used semiconductor wafer is a Si wafer having a diameter of 300 mm.

The wafer according to Example 1 is subjected to a probe inspection and the number of bumps sticking to probe needles is 0. On the other hand, the wafer according to Comparative Example subjected to a probe inspection has 11 bumps sticking to probe needles.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A method of manufacturing a semiconductor device comprising the steps of:
   preparing a wafer including effective areas to be commercially available semiconductor chips and non-effective areas to be commercially unavailable semiconductor chips at a periphery of the wafer, each of the effective areas having a plurality of first pad electrodes, and each of the non-effective areas having a plurality of second pad electrodes and a plurality of third pad electrodes;
   forming a bump-formation insulating film over the first pad electrodes, the second pad electrodes and the third pad electrodes;
   removing the bump-formation insulating film from over a portion of the first pad electrodes to form first openings, and from over an entirety of the second pad electrodes and third pad electrodes, the third pad electrodes intersecting an edge of a light-shielding member;
   forming a photosensitive film over the bump-formation insulating film, the first pad electrodes, and the second pad electrodes;
   exposing to light the photosensitive film over the wafer with the periphery covered by the light-shielding member;
   forming bump-formation openings in the photosensitive film over the first pad electrodes, the second pad electrodes, and the third pad electrodes by developing the photosensitive film; and
   forming bumps in the bump-formation openings by plating the wafer with the photosensitive film as a mask.

2. The method of manufacturing the semiconductor device according to claim 1,
   wherein in the step of removing the bump-formation insulating film, the bump-formation insulating film in the bump-formation openings over the third pad electrodes is removed so that any residue of the bump-formation insulating film does not remain.

3. The method of manufacturing the semiconductor device according to claim 1,
   wherein each of the bumps over the first pad electrodes has a diameter of 1, and, wherein in the step of removing the bump-formation insulating film, the bump-formation insulating film is removed from over the third pad electrodes and from within a range extending a distance 0.5×1 from the third pad electrodes.

4. The method of manufacturing the semiconductor device according to claim 1,
wherein each of the bumps over the first pad electrodes has a diameter of 1, and,
wherein in the step of removing the bump-formation insulating film, the bump-formation insulating film is removed from between a line positioned 1×2 inward from the edge of the light-shielding member and a peripheral edge of the wafer.

5. The method of manufacturing the semiconductor device according to claim 1,
wherein in the step of removing the bump-formation insulating film, the entire bump-formation insulating film in the non-effective areas is removed.

6. The method of manufacturing the semiconductor device according to claim 1,
wherein the bumps over the third pad electrodes are smaller than the bumps over the first pad electrodes.

7. A method of manufacturing a semiconductor device comprising the steps of:
preparing a wafer including effective areas to be commercially available semiconductor chips and non-effective areas to be commercially unavailable semiconductor chips at a periphery of the wafer, each of the effective areas having a plurality of pad electrodes;
forming a bump-formation insulating film over the pad electrodes and the non-effective areas;
removing the bump-formation insulating film from over a portion of the plurality of pad electrodes in the effective areas to form openings, and from over an entirety of the pad electrodes in the non-effective areas, through exposure of the bump-formation insulating film to light and development;
forming a photosensitive film over the bump-formation insulating film and the pad electrodes;
exposing to light the photosensitive film over the wafer with the periphery covered by a light-shielding member;
forming bump-formation openings in the photosensitive film over the pad electrodes by developing the photosensitive film, and forming dummy-formation openings in the non-effective areas, the dummy-formation openings being in the shape of a frame and larger in area than the bump-formation openings; and
forming bumps in the bump-formation openings and forming dummy bumps in the dummy-formation openings by plating.

8. The method of manufacturing the semiconductor device according to claim 7,
wherein the dummy-formation openings and the dummy bumps are formed along the edges of the non-effective areas, respectively.

9. The method of manufacturing the semiconductor device according to claim 7,
wherein each of the non-effective areas is in the shape of a rectangle, and
wherein each of the dummy-formation openings has a width in portions diagonally facing corners of the rectangle, the width being wider than a width in portions along with sides of the rectangle.

10. The method of manufacturing the semiconductor device according to claim 7,
wherein the dummy-formation opening has inner sides curved toward the inside of the dummy-formation opening,
wherein the light-shielding member has an inner side curved toward the inside of the light-shielding member, and
wherein the radius of curvature of the inner sides of the dummy-formation opening is smaller than the radius of curvature of the inner side of the light-shielding member.

11. The method of manufacturing the semiconductor device according to claim 1, further comprising a step of inspecting the commercially available semiconductor chips by bringing a probe into contact with the bumps in the effective areas and the bumps in the non-effective areas.

* * * * *

UNITED STATES PATENT AND TRADEMARK OFFICE
CERTIFICATE OF CORRECTION

| | | |
|---|---|---|
| PATENT NO. | : 9,070,754 B2 | Page 1 of 1 |
| APPLICATION NO. | : 13/752194 | |
| DATED | : June 30, 2015 | |
| INVENTOR(S) | : Akinori Yutani et al. | |

It is certified that error appears in the above-identified patent and that said Letters Patent is hereby corrected as shown below:

On the title page, item (73) in the Assignee, replace "Kawasaki-shi, Kanagwa, JAPAN" with "Kawasaki-shi, Kanagawa, JAPAN".

Signed and Sealed this
Fifteenth Day of September, 2015

Michelle K. Lee
*Director of the United States Patent and Trademark Office*